United States Patent [19]
Becher

[11] Patent Number: 5,864,561
[45] Date of Patent: Jan. 26, 1999

[54] CIRCUIT ARRANGEMENT WITH A MULTIPLEXER

[76] Inventor: Erwin Becher, Guggemoos 21, D-87466 Oy-Mittelberg, Germany

[21] Appl. No.: 686,196

[22] Filed: Jul. 24, 1996

[30] Foreign Application Priority Data

Jul. 29, 1995 [EP] European Pat. Off. ............. 95112054

[51] Int. Cl.$^6$ ...................................................... H04J 3/02
[52] U.S. Cl. ........................................... 370/537; 327/407
[58] Field of Search ..................................... 370/532, 533, 370/534, 535, 536, 537, 538, 539, 540, 541, 522, 351; 340/825, 825.03, 870.13; 327/407, 408, 411, 409, 410, 412, 413, 414, 365, 403, 551, 561; 330/295, 75, 84

[56] References Cited

U.S. PATENT DOCUMENTS

| | | | |
|---|---|---|---|
| 3,249,883 | 5/1966 | Berneike | 370/532 |
| 3,665,108 | 5/1972 | Bowers, Jr. | 370/533 |
| 4,017,687 | 4/1977 | Hartzler et al. | 370/537 |
| 4,056,686 | 11/1977 | Zielinski . | |
| 4,530,365 | 7/1985 | Harada et al. . | |
| 4,891,807 | 1/1990 | Hutch | 370/537 |
| 4,905,238 | 2/1990 | Rinaldis | 370/537 |
| 5,148,121 | 9/1992 | Uchida . | |

FOREIGN PATENT DOCUMENTS 0 051 578 5/1982 European Pat. Off. .
2148774 3/1973 France .

Primary Examiner—Wellington Chin
Assistant Examiner—Huy D. Vu
Attorney, Agent, or Firm—Bose McKinney & Evans

[57] ABSTRACT

To connect one out of N signal channels ($K_1$, $K_2$, $K_N$) each having a signal line ($L_1$, $L_2$, $L_N$) and a channel zero line ($N_1$, $N_2$, $N_N$), where N is greater than one, to one input of a (differential) amplifier (1) whose circuit is referenced to an associated ground (SN), a one-out-of-N multiplexer (2) is provided having 3N switching paths ($S_{11}$, $S_{21}$, $S_{31}$, $S_{12}$, $S_{22}$, $S_{32}$, $S_{1N}$, $S_{2N}$, $S_{3N}$), a first ($S_{11}$, $S_{12}$, $S_{1N}$) of which serves to connect the N signal lines ($L_1$, $L_2$, $L_N$) to said input, and a second ($S_{21}$, $S_{22}$, $S_{2N}$) of which serves to advance the N channel zero lines ($N_1$, $N_2$, $N_N$). The respective inputs of the switching paths of a third switching-path set ($S_{31}$, $S_{32}$, $S_N$) are connected to the respective inputs of the switching paths of the second switching-path set ($S_{21}$, $S_{22}$, $S_{2N}$), and the outputs of the latter are commoned to one input of an auxiliary (differential) amplifier (3). The outputs of the third switching-path set ($S_{31}$, $S_{23}$, $S_{2N}$) are commoned to the output of the auxiliary (differential) amplifier, whose circuit is referenced to the ground (SN) of the (differential) amplifier (1).

2 Claims, 1 Drawing Sheet

CIRCUIT ARRANGEMENT WITH A MULTIPLEXER

FIELD OF THE INVENTION

The present invention relates to a circuit arrangement for connecting a plurality of signal lines to an input of a differential amplifier by means of a multiplexer.

BACKGROUND OF THE INVENTION

Such circuit arrangements are needed, for example, if signal channels which carry signals originating from several measuring points with suitable sensors are to be alternately or successively connected to the input of a differential amplifier. Each signal channel generally has a signal line and a channel zero line.

The channel zero line need not necessarily be connected to ground, as in the case of a battery, for example, where the signal line and the channel zero line serve to connect the two terminals of the battery to desired points of a circuit.

Normally, the multiplexer serves to connect both the signal line and the channel zero line to the differential amplifier; thus, a two-terminal through-connection is made.

SUMMARY OF THE INVENTION

However, problems are caused by the fact that the individual channel zero lines may be affected by interference voltages, which depend in particular on the type and place of the ground to which the respective channel zero line is connected, and on the distance between that place and the differential amplifier, i.e., generally on the length of the channel zero line. The channel zero lines may also carry interference currents which result in equivalent interference voltages, for which comparable considerations apply.

Since, in addition, the interference voltages may have different amplitudes from signal channel to signal channel, the input of the differential amplifier to which the channel zero lines are connected is fed with voltages which differ from one signal channel to another. Therefore, the output of the differential amplifier has different interference components, particularly zero offsets, and unacceptable compensating currents flow at the input end of the differential amplifier.

The problem described is particularly disturbing if the output signal from the differential amplifier is to be further processed, e.g., if the signal is to be made visible or recorded by means of readout equipment, particularly a chart recorder.

Attempts have been made to solve the problem by electrically isolating the differential amplifier and the signal channels from each other, e.g., by means of transformers or optocouplers. This, however, is expensive, particularly if a great number of signal channels are present.

To solve the problem described, the invention provides a circuit arrangement for a single-terminal through-connection of one out of N signal channels each comprising a signal line and a channel zero line, where N is greater than one, to an input of an amplifier whose circuit is referenced to an associated ground, using a one-out-of-N multiplexer having 3N switching paths, a first switching-path set serving to connect through the N signal lines, a second switching-path set serving to advance the N channel zero lines, the respective inputs of the switching paths of a third switching-path set being connected to the respective inputs of the switching paths of the second switching-path set, the outputs of the second switching-path set being commoned to an input of an auxiliary amplifier, and the outputs of the third switching-path set being commoned to the output of the auxiliary amplifier, whose circuit is referenced to the ground of the amplifier.

In a preferred embodiment of the invention, the amplifier and the auxiliary amplifier are each implemented with a differential amplifier having one of its inputs connected to the ground of the amplifier.

One advantage of the invention is that only the signal lines are connected through to the input of the amplifier or differential amplifier, while the interference voltages on the channel zero lines are compensated for by means of the auxiliary amplifier or auxiliary differential amplifier, the latter having its other input connected to the ground of the amplifier. Therefore, mutual interference between the individual signal lines is also suppressed. Thus, unlike the above-explained two-terminal through-connections, the invention proposes a single-terminal through-connection.

BRIEF DESCRIPTION OF THE DRAWING

The invention will now be explained in more detail with reference to the single figure of the accompanying drawing, in which the principle underlying the invention is illustrated schematically in the manner of a block diagram with the aid of an embodiment.

DETAILED DESCRIPTION OF THE DRAWINGS

Figure 1:
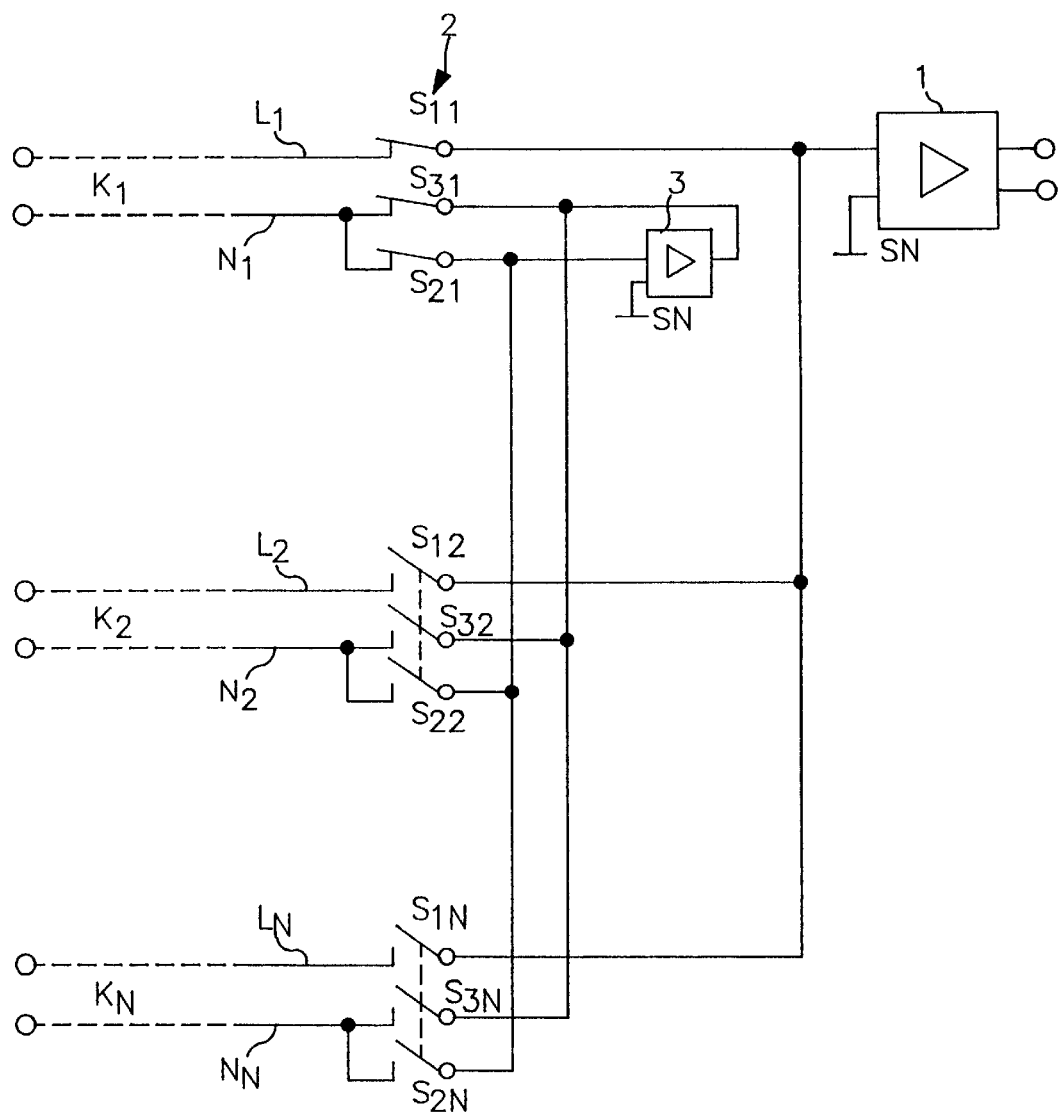

Of N signal channels, where N is greater than one, three are shown in the figure, namely signal channels $K_1$, $K_2$, $K_N$. Each of them has a respective signal line $L_1$, $L_2$, $L_N$ and a respective channel zero line $N_1$, $N_2$, $N_N$.

The signal lines and the channel zero lines establish the connections with respective signal sources, e.g., with respective measuring points each comprising a suitable physical-to-electrical transducer, e.g., a so-called sensor. The signal lines and the channel zero lines may have arbitrary lengths, which is illustrated in the figure by portions thereof shown as broken lines.

Each of the channel zero lines $N_1$, $N_2$, $N_N$ may be connected to a separate ground associated, for example, with the aforementioned measuring point, as was explained by way of introduction, but this is not shown in the figure.

By means of a one-out-of-N multiplexer 2, one of the N signal channels $K_1$, $K_2$, $K_N$ can be connected to an amplifier 1 at a time. To this end, the one-out-of-N multiplexer 2 has 3N switching paths $S_{11}$, $S_{12}$, $S_{31}$, $S_{12}$, $S_{22}$, $S_{32}$, $S_{1N}$, $S_{SN}$, $S_{3N}$, which can be thought of as grouped into a first switching-path set consisting of switching paths $S_{11}$, $S_{12}$, $S_{1N}$, a second switching-path set consisting of switching paths $S_{21}$, $S_{22}$, $S_{2N}$, and a third switching-path set consisting of switching paths $S_{31}$, $S_{32}$, $S_{3N}$.

In the figure, the one-out-of-N multiplexer is shown implemented with a mechanical switch. It is, however, within the scope of the invention to implement the switching paths and their control with electronic switches, particularly with semiconductor switches.

To illustrate the operation of the one-out-of-N multiplexer 2, the switching paths $S_{11}$, $S_{21}$, $S_{31}$ associated with the first signal channel $K_1$ are shown closed, while the other switching paths are shown open.

The first switch-path set $S_{11}$, $S_{12}$, $S_{1N}$ serves to connect the N signal lines $L_1$, $L_2$, $L_N$ to one input of the amplifier 1, whose circuit is referenced to an associated ground SN. The second switching-path set $S_{21}$, $S_{22}$, $S_{SN}$ serves to advance the N channel zero lines $N_1$, $N_2$, $N_N$.

To this end, the respective inputs of the switching paths $S_{31}$, $S_{32}$, $S_{3N}$ of the third switching-path set are connected to the respective inputs of the switching paths $S_{21}$, $S_{22}$, $S_{2N}$ of the second switching-path set, while the outputs of the latter are commoned to one input of an auxiliary amplifier 3. The circuit of the latter is also referenced, or connected, to the ground SN of the amplifier 1. The outputs of the third switching-path set $S_{31}$, $S_{32}$, $S_{3N}$ are commoned to the output of the auxiliary amplifier 3.

Thus, through the "short circuit" between the output and input of the auxiliary amplifier 3, the potential of the ground SN is applied to the multiplexer-input-side end of the respective channel zero line $N_1$, $N_2$, $N_N$ after each switching step of the one-out-of-N multiplexer 2.

Accordingly, the above-mentioned compensating currents and/or offsets cannot adversely affect the output fo the amplifier 2, and in contrast to the above-described two-terminal through-connections to a differential amplifier, only a single-terminal through-connection to the amplifier 1 is provided.

The amplifier 1 and the auxiliary amplifier 3 are shown in the figure of the drawing as differential amplifiers, which implementation is preferred.

As briefly mentioned above, the signal appearing at the output of the amplifier 1 can be recorded and/or made visible in analog or digital form by means of readout equipment, such as a chart recorder or a liquid-crystal display. The subject matter of the invention is thus preferably part of such readout equipment. If the output signal is recorded or displayed digitally, the amplifier 1 must be succeeded by an analog-to-digital converter.

I claim:

1. A circuit arrangement for a single-terminal through-connection of one out of N signal channels each comprising a signal line and a channel zero line, where N is greater than one, to an input of an amplifier whose circuit is referenced to an associated ground, using a one-out-of-N multiplexer having 3N switching paths, a first switching-path set serving to connect through the N signal lines, a second switching-path set serving to advance the N channel zero lines, the respective inputs of the switching paths of a third switching-path set being connected to the respective inputs of the switching paths of the second switching-path set, the outputs of the second switching-path set being commoned to an input of an auxiliary amplifier, and the outputs of the third switching-path set being commoned to the output of the auxiliary amplifier, whose circuit is referenced to the ground of the amplifier.

2. A circuit arrangement as claimed in claim 1 wherein the amplifier and the auxiliary amplifier are each implemented with a differential amplifier having one of its inputs connected to the ground of the amplifier.

* * * * *